(12) United States Patent
Ahn et al.

(10) Patent No.: US 10,008,340 B2
(45) Date of Patent: *Jun. 26, 2018

(54) COMPOSITE ELECTRONIC COMPONENT, BOARD HAVING THE SAME, AND POWER SMOOTHER INCLUDING THE SAME

(71) Applicant: SAMSUNG ELECTRO-MECHANICS CO., LTD., Suwon-Si, Gyeonggi-Do (KR)

(72) Inventors: Young Ghyu Ahn, Sunwon-Si (KR); Byoung Hwa Lee, Suwon-Si (KR); Sang Soo Park, Suwon-Si (KR); Oh Choon Kwon, Suwon-Si (KR); Hong Kyu Shin, Suwon-Si (KR); Hyun Sub Oh, Suwon-Si (KR); Jae Hyuk Choi, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 89 days.

This patent is subject to a terminal disclaimer.

(21) Appl. No.: 14/732,667

(22) Filed: Jun. 5, 2015

(65) Prior Publication Data

US 2016/0020041 A1    Jan. 21, 2016

(30) Foreign Application Priority Data

Jul. 17, 2014  (KR) .................. 10-2014-0090639
Oct. 8, 2014   (KR) .................. 10-2014-0136013

(51) Int. Cl.
*H01G 15/00*    (2013.01)
*H01G 4/38*     (2006.01)
(Continued)

(52) U.S. Cl.
CPC ............. *H01G 15/00* (2013.01); *H01G 2/106* (2013.01); *H01G 4/232* (2013.01); *H01G 4/30* (2013.01);
(Continued)

(58) Field of Classification Search
CPC .......... H01G 4/224; H01G 9/15; H01G 9/052; H01G 9/08; H01G 9/0029; H01G 9/025;
(Continued)

(56) References Cited

U.S. PATENT DOCUMENTS 7,352,563 B2 * 4/2008 Pelcak .................. H01G 9/012
                                                361/329
8,411,417 B2   4/2013 Kim et al.
(Continued)

FOREIGN PATENT DOCUMENTS

CN    101042960 A    9/2007
CN    101996778 A    3/2011
(Continued)

OTHER PUBLICATIONS

Chinese Office Action dated May 31, 2017 in corresponding Chinese Patent Application No. 201510379613.5. (31 pages in English and 18 pages in Chinese).
(Continued)

*Primary Examiner* — Dion R Ferguson
(74) *Attorney, Agent, or Firm* — NSIP Law

(57) ABSTRACT

A composite electronic component includes a composite body formed by combining a multilayer ceramic capacitor (MLCC) and a tantalum capacitor. The composite electronic component has an excellent acoustic noise reduction effect, low equivalent series resistance (ESR)/equivalent series inductance (ESL), enhanced DC-bias characteristics, and a reduced chip thickness.

35 Claims, 12 Drawing Sheets

(51) Int. Cl.

| | |
|---|---|
| *H01G 4/30* | (2006.01) |
| *H01G 9/15* | (2006.01) |
| *H01G 9/012* | (2006.01) |
| *H02M 1/08* | (2006.01) |
| *H01G 4/40* | (2006.01) |
| *H01G 9/28* | (2006.01) |
| *H01G 2/10* | (2006.01) |
| *H01G 4/232* | (2006.01) |
| *H01G 4/12* | (2006.01) |
| *H01G 9/042* | (2006.01) |
| *H02M 3/335* | (2006.01) |
| *H05K 1/18* | (2006.01) |

(52) U.S. Cl.
CPC ............... *H01G 4/38* (2013.01); *H01G 4/40* (2013.01); *H01G 9/012* (2013.01); *H01G 9/28* (2013.01); *H02M 1/08* (2013.01); *H01G 4/12* (2013.01); *H01G 9/042* (2013.01); *H01G 9/15* (2013.01); *H02M 3/33507* (2013.01); *H05K 1/181* (2013.01); *H05K 2201/10015* (2013.01); *Y02B 70/1433* (2013.01)

(58) Field of Classification Search
CPC ........ H01G 2/106; H01G 4/008; H01G 4/236; H01G 4/306; H01G 4/33; H01G 9/042; H01G 9/0525; H01G 9/10; H01G 9/14
See application file for complete search history.

(56) References Cited

U.S. PATENT DOCUMENTS

| | | | |
|---|---|---|---|
| 9,171,672 B2* | 10/2015 | McConnell | H01G 4/232 |
| 2011/0038102 A1* | 2/2011 | Kim | H01G 9/008 |
| | | | 361/523 |
| 2013/0016488 A1 | 1/2013 | McConnell et al. | |
| 2014/0104909 A1 | 4/2014 | Kwong et al. | |
| 2016/0020032 A1* | 1/2016 | Shin | H01G 4/38 |
| | | | 174/260 |

FOREIGN PATENT DOCUMENTS

| | | |
|---|---|---|
| CN | 103560686 A | 2/2014 |
| CN | 103688457 A | 3/2014 |
| EP | 2869446 A1 | 5/2015 |
| GB | 2436211 A | 9/2007 |
| JP | 09-232196 A | 9/1997 |
| JP | 09-326334 A | 12/1997 |
| JP | 2000-173860 A | 6/2000 |
| JP | 2003-234246 A | 8/2003 |

OTHER PUBLICATIONS

Chinese Office Action dated Feb. 27, 2018 in Chinese Patent Application No. 201510379613.5 (30 pages in English, 20 pages in Chinese).

* cited by examiner

COMPOSITE ELECTRONIC COMPONENT, BOARD HAVING THE SAME, AND POWER SMOOTHER INCLUDING THE SAME

CROSS-REFERENCE TO RELATED APPLICATIONS

This application claims the priority and benefit of Korean Patent Application Nos. 10-2014-0090639 filed on Jul. 17, 2014 and 10-2014-0136013 filed on Oct. 8, 2014, with the Korean Intellectual Property Office, the disclosures of which are incorporated herein by reference.

TECHNICAL FIELD

The present disclosure relates to a composite electronic component having a plurality of passive elements.

BACKGROUND

A multilayer ceramic capacitor, a multilayer chip electronic component, is a chip-type condenser installed on the printed circuit boards (PCBs) of various electronic products such as image display devices (or video display apparatuses) including liquid crystal displays (LCDs), plasma display panels (PDPs), and the like, as well as computers, personal digital assistants (PDAs), cellular phones, and the like, to charge or discharge electricity.

A multilayer ceramic capacitor (MLCC), having advantages such as compactness, guaranteed high capacitance, and ease in the mounting thereof, may be used as a component of various electronic devices.

Such an MLCC may include a plurality of dielectric layers and internal electrodes and may have a structure in which the internal electrodes having opposing polarities are alternately disposed between the dielectric layers.

The dielectric layers may have piezoelectric and electrostrictive properties. Thus, when a direct current (DC) or alternating current (AC) voltage is applied to an MLCC, a piezoelectric phenomenon may occur between internal electrodes, thereby generating vibrations.

Vibrations may be transferred to a PCB on which the MLCC is mounted, through solders of the MLCC, leading to the entirety of the PCB acting as an acoustically radiating surface to generate vibratory sound as noise.

Vibratory sound may correspond to audio frequencies ranging from 20 Hz to 20,000 Hz, causing listener discomfort, and such a vibratory sound, which may cause listener discomfort, is commonly known as acoustic noise.

In order to reduce acoustic noise, a product in which a thickness of a lower cover layer of an MLCC is increased has been studied.

However, further research into a product having improved acoustic noise reduction effects is required.

SUMMARY

An aspect of the present disclosure may provide a composite electronic component having excellent acoustic noise reduction effects.

An aspect of the present disclosure may also provide a composite electronic component having low equivalent series resistance (ESR)/equivalent series inductance (ESL), enhanced DC-bias characteristics, and a reduced chip thickness.

According to an aspect of the present disclosure, a composite electronic component may include a composite body having a multilayer ceramic capacitor (MLCC) and a tantalum capacitor, wherein, in a line of a line graph of equivalent series resistance (ESR) of an input signal over frequency, points of inflection of the ESR occur in at least one region prior to or subsequent to a point of self resonant frequency (SRF).

According to another aspect of the present disclosure, a composite electronic component may include an insulating sheet, conductive connectors disposed on one or both of upper and lower surfaces of the insulating sheet. A composite body is disposed on the upper surface of the insulating sheet. The composite body is formed by combining a multilayer ceramic capacitor (MLCC), including a ceramic body in which a plurality of dielectric layers and internal electrodes are stacked such that the internal electrodes face one another with the dielectric layer interposed therebetween. First and second external electrodes are disposed on exterior surfaces of the ceramic body. The MLCC includes a tantalum capacitor containing tantalum powder and including a body having a tantalum wire disposed in one end portion of the body. A mold covers the composite body. An anode terminal is disposed on a first lateral surface and a lower surface of the mold in a length direction and is connected to the tantalum wire and the first external electrode. A cathode terminal is disposed on a second lateral surface and a lower surface of the mold in the length direction and is connected to the body of the tantalum capacitor and the second external electrode.

According to another aspect of the present disclosure, a composite electronic component includes an input terminal receiving power converted by a power manager. A power smoother includes a multilayer ceramic capacitor (MLCC) including a ceramic body in which a plurality of dielectric layers and internal electrodes are stacked such that the internal electrodes face one another with the dielectric layer interposed therebetween. The MLCC includes a tantalum capacitor containing tantalum powder and including a body having a tantalum wire protruded from one end portion of the body. The tantalum capacitor smoothes the power. A ground terminal bypasses ripples in the power, and the power smoother reduces ripples in the provided power.

According to another aspect of the present disclosure, a board having a composite electronic component may include a printed circuit board (PCB) having electrode pads provided on the PCB. The composite electronic component is installed on the PCB. A solder connects the electrode pads and the composite electronic component.

According to another aspect of the present disclosure, a power smoother may include a battery, a first power smoother smoothing power supplied from the battery, a power manager converting power provided from the first power smoother through a switching operation, and a second power smoother smoothing power provided from the power manager. The first power smoother or the second power smoother includes a composite electronic component formed by combining a capacitor, including a ceramic body in which a plurality of dielectric layers and internal electrodes are stacked such that the internal electrodes face one another with the dielectric layer interposed therebetween, and a tantalum capacitor containing tantalum powder and including a body having a tantalum wire protruded from one end portion of the body. The composite electronic component reduces ripples in the provided power.

According to another aspect of the present disclosure, a composite electronic component comprises a multilayer ceramic capacitor (MLCC) and a tantalum capacitor disposed on a first insulating sheet and embedded in a mold.

The MLCC includes a ceramic body, in which a plurality of dielectric layers and internal electrodes are stacked in an alternating sequence, and first and second external electrodes are disposed on opposing exterior surfaces of the ceramic body. The tantalum capacitor contains tantalum powder and includes a body with a tantalum wire protruding from one end of the body. The mold includes first and second terminals disposed on opposing sides of the mold. The tantalum wire and the first external electrode are electrically connected to the first terminal, and the tantalum capacitor body and the second external electrode are electrically connected to the second terminal.

BRIEF DESCRIPTION OF DRAWINGS

The above and other aspects, features and other advantages of the present disclosure will be more clearly understood from the following detailed description taken in conjunction with the accompanying drawings.

DETAILED DESCRIPTION

Figure 1A:
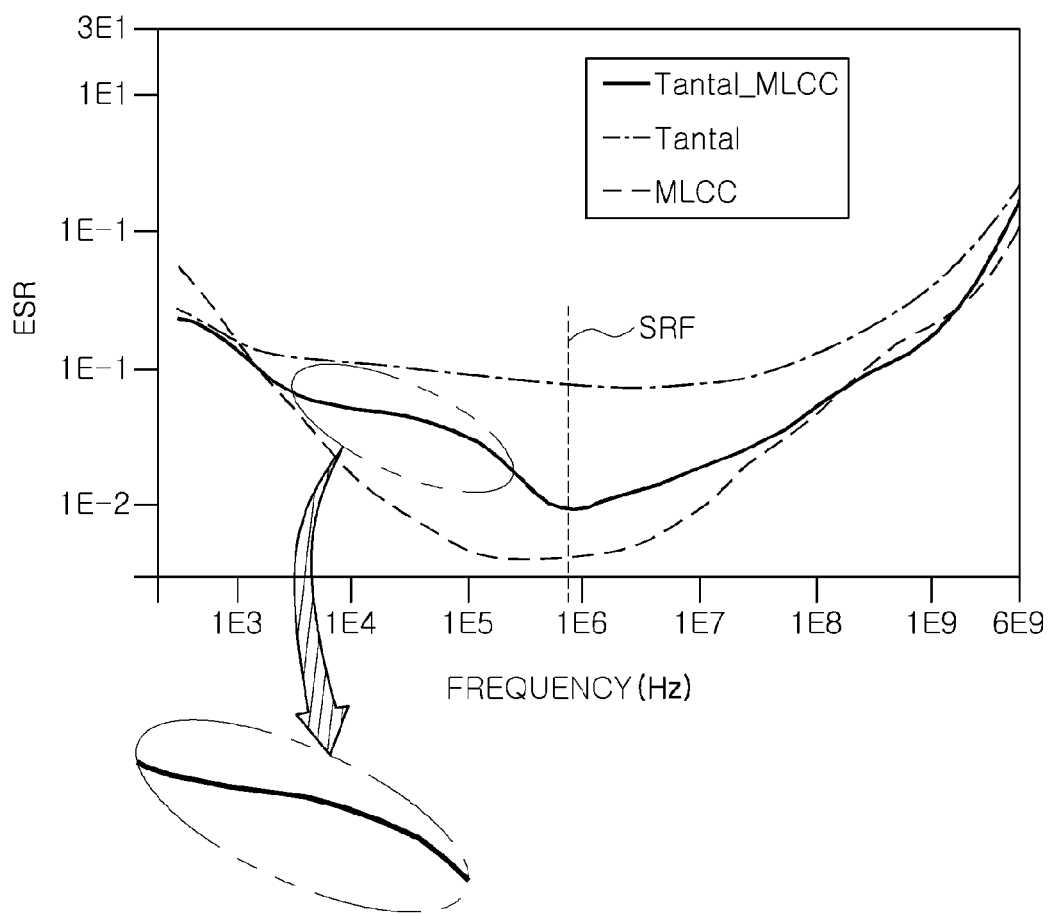
FIGS. 1A and 1B are line graphs illustrating equivalent series resistance (ESR) and impedance of a composite electronic component according to an exemplary embodiment of the present disclosure and composite electronic components according to comparative examples over frequency.

Hereinafter, embodiments of the present disclosure will be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

In order to clarify embodiments of the present disclosure, directions of the hexahedron may be defined as follows: L, W, and T indicated in the drawings denote a length direction, a width direction, and a thickness direction, respectively.

Composite Electronic Component

Hereinafter, exemplary embodiments of the present disclosure will be described in detail with reference to the accompanying drawings.

Figure 1B:
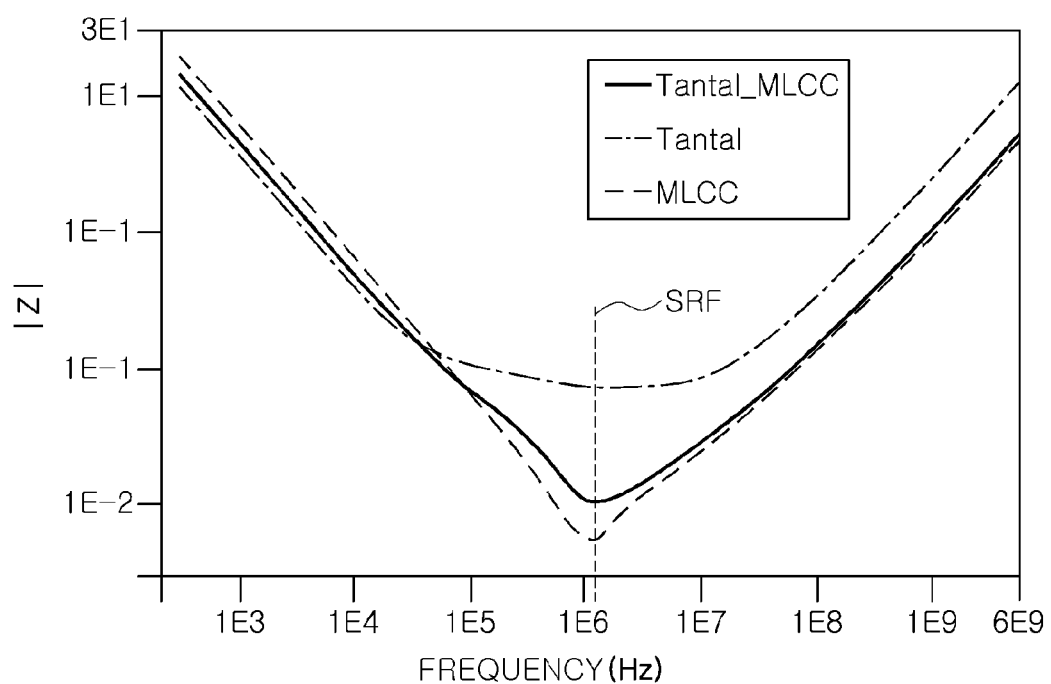

FIGS. 1A and 1B are line graphs illustrating equivalent series resistance (ESR) and impedance of a composite electronic component according to an exemplary embodiment of the present disclosure and composite electronic components according to comparative examples over frequency.

Referring to FIGS. 1A and 1B, in a composite electronic component according to an exemplary embodiment of the present disclosure, a line of a line graph of equivalent series resistance (ESR) and impedance of an input signal over frequency has points of inflection of ESR and impedance occur in at least one frequency region prior to or subsequent to a point of self-resonant frequency (SRF).

For example, according to an exemplary embodiment of the present disclosure, in the graph of impedance over frequency, impedance of a tantalum capacitor appears in a low frequency region and impedance of an MLCC appears in a high frequency region.

Thus, in the graph of ESR and impedance over frequency of an input signal, points of inflection of ESR and impedance occur in at least one region prior to or subsequent to a point of SRF.

The points of inflection of ESR and impedance may occur in at least one region prior to or subsequent to the point of SRF or may be generated in both of the previous and subsequent frequency regions.

Since the points of inflection of ESR and impedance occur in at least one region prior to or subsequent to the point of SRF, the composite electronic component according to an exemplary embodiment of the present disclosure may have relatively low ESR.

The composite electronic component according to an exemplary embodiment of the present disclosure includes a combination of a multilayer ceramic capacitor (MLCC) and a tantalum capacitor.

According to an exemplary embodiment of the present disclosure, the MLCC and the tantalum capacitor may be connected in parallel.

According to an exemplary embodiment of the present disclosure, the composite electronic component includes an insulating sheet on which an MLCC and a tantalum capacitor are mounted, and a mold formed to surround the MLCC and the tantalum capacitor.

According to an exemplary embodiment of the present disclosure, the composite electronic component includes an anode terminal and a cathode terminal electrically connected to the MLCC and/or the tantalum capacitor.

According to an exemplary embodiment of the present disclosure, in the composite electronic component, the MLCC is disposed within an assembly structure of the tantalum capacitor without a lead frame, and the tantalum capacitor and the MLCC are connected in parallel, thus obtaining high capacity.

According to an exemplary embodiment of the present disclosure, an insulating layer may be disposed between the tantalum capacitor and the MLCC, and short-circuits may be prevented by the insulating layer.

Hereinafter, a specific structure of the composite electronic component according to an exemplary embodiment will be described in detail.

Figure 2:
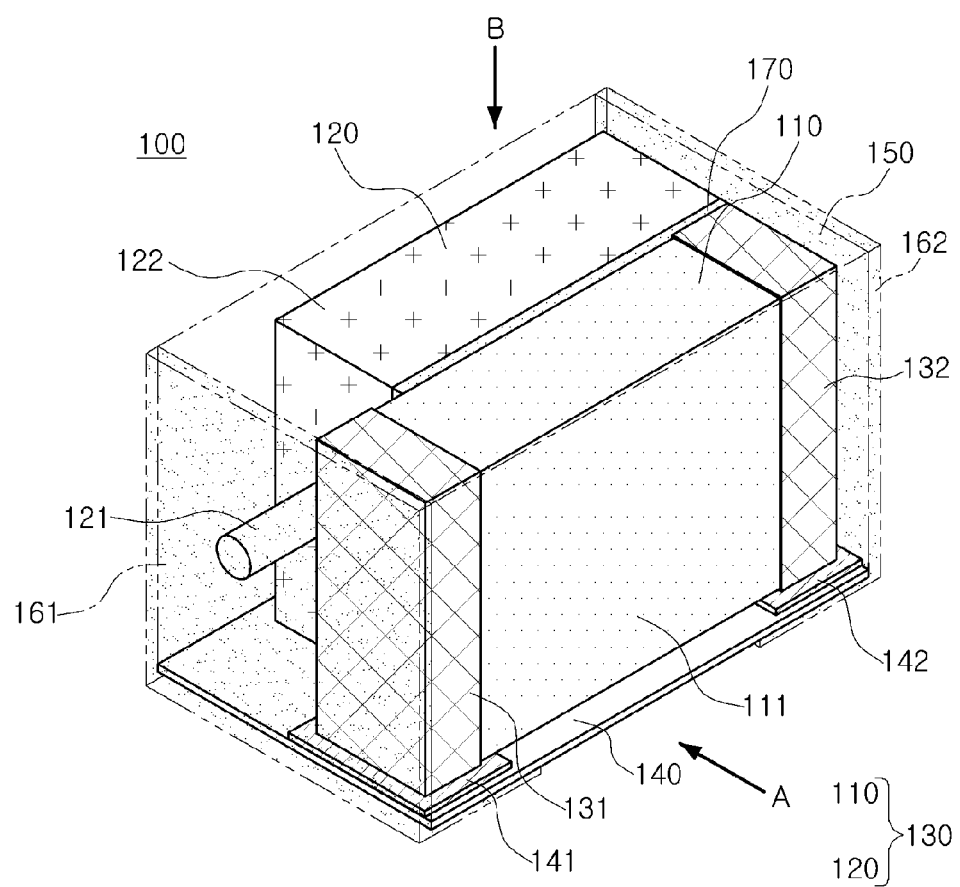
FIG. 2 is a schematic perspective view illustrating a terminal electrode and a mold of a composite electronic component according to a first exemplary embodiment of the present disclosure.

FIG. 2 is a schematic perspective view illustrating a terminal electrode and a mold of a composite electronic component according to a first exemplary embodiment of the present disclosure.

Referring to FIG. 2, a composite electronic component according to the first exemplary embodiment of the present disclosure includes an insulating sheet 140, conductive connectors 141 and 142 disposed on one or both of upper and lower surfaces of the insulating sheet 140, and a composite body disposed on the upper surface of the insulating sheet 140 and formed by combining an MLCC 110 including a ceramic body 111, in which a plurality of dielectric layers and internal electrodes are stacked such that the internal electrodes face one another with the respective dielectric layer interposed therebetween and first and second external electrodes 131 and 132 disposed on exterior surfaces of the ceramic body 111 and a tantalum capacitor 120 containing tantalum powder and including a body 122 having a tantalum wire 121 disposed in one end portion thereof.

The MLCC is not particularly limited, and any commonly used MLCC may be used therefor.

For example, the MLCC 110 includes the ceramic body 111 in which a plurality of dielectric layers and internal electrodes are stacked such that internal electrodes face one another with the dielectric layers interposed therebetween.

The MLCC 110 includes the first and second external electrodes 131 and 132 disposed on exterior surfaces of the ceramic body 111. The first and second external electrodes 131 and 132 may be formed using conductive paste including a conductive metal.

Although not particularly limited, as the conductive metal, nickel (Ni), copper (Cu), palladium, or alloys thereof may be used.

According to an exemplary embodiment of the present disclosure, a nickel (Ni)/tin (Sn) plating layer may not be disposed on the first and second external electrodes 131 and 132, unlike a general MLCC.

The composite electronic component includes a mold 150 enclosing the composite body 130 including the MLCC 110 disposed on the upper surface of the insulating sheet 140 and the tantalum capacitor 120, and thus, a plating layer may not be disposed on the first and second external electrodes 131 and 132 of the MLCC 110. Thus, degradations in device performance due to penetration of a plating solution into the ceramic body 111 of the MLCC 110 may be eliminated.

According to an exemplary embodiment of the present disclosure, the tantalum capacitor 120 includes the body 122 and the tantalum wire 121, and the tantalum wire 121 may be partially embedded in the body 122 such that a portion thereof is exposed in a length direction.

Although not particularly limited, the body 122 of the tantalum capacitor 120 may include an anode body, a dielectric layer, a solid electrolyte layer, a carbon layer, and a cathode layer.

The anode body may be formed using a tantalum material and configured of a porous sintered body of tantalum powder.

A dielectric layer may be formed on a surface of the anode body. The dielectric layer may be formed by oxidizing a surface of the anode body. For example, the dielectric layer is formed of a formed of tantalum oxide, such as $Ta_2O_5$ dielectric material as an oxide of tantalum forming the anode body. The dielectric material may have a predetermined thickness on a surface of the anode body.

A solid electrolytic layer may be formed on a surface of the dielectric layer. The solid electrolytic layer may include a conductive polymer. When the solid electrolytic layer is formed of a conductive polymer, the solid electrolytic layer may be formed on a surface of the dielectric layer through a chemical polymerization process or an electropolymerization process. As the conductive polymer material, any polymer may be used, without being particularly limited, as long as it has conductivity Examples of the conductive polymer material may include polypyrrole, polythiophene, polyaniline, and the like.

A carbon layer including a carbon may be disposed on the solid electrolytic layer.

The carbon layer may be formed using carbon paste. In this case, the carbon paste may be formed by mixing a conductive carbon material powder, such as natural graphite or carbon black with a binder, a dispersing agent, or the like, and adding the mixture to water or an organic solvent to form a paste, and the carbon paste may be applied to the solid electrolytic layer to form the carbon layer.

A cathode layer may be disposed on the carbon layer to enhance electrical connectivity with a cathode terminal, and a conductive metal included in the cathode layer may be silver (Ag).

Although not particularly limited, the tantalum capacitor may be, for example, a tantalum capacitor having a structure without an internal lead frame.

According to an exemplary embodiment of the present disclosure, due to the structure of the composite electronic component including the composite body as a combination of the MLCC and the tantalum capacitor, acoustic noise may be significantly reduced, relatively high capacitance may be obtained, equivalent series resistance (ESR)/equivalent series inductance (ESL) may be reduced, DC-bias characteristics may be enhanced, and a chip thickness may be reduced.

The tantalum capacitor may have high capacitance and excellent DC-bias characteristics, and have characteristics that acoustic noise is not generated when the tantalum capacitor is mounted on a board.

In the meantime, the tantalum capacitor may have a problem in that it may have relatively high ESR.

On the other hand, the MLCC may have low ESR/ESL characteristics, but poor DC-bias characteristics and it may difficult to realize high capacitance therein.

Also, the MLCC has a large chip thickness and acoustic noise is generated when the MLCC is mounted on a board.

Here, as the composite electronic component according to an exemplary embodiment of the present disclosure includes the composite body as a combination of the MLCC and the tantalum capacitor, the problems of high ESR and shortcomings of the tantalum capacitor, may be reduced.

Also, low DC-bias characteristics and the shortcomings of the MLCC, may be improved, and a chip thickness may be reduced.

In addition, since the MLCC generating acoustic noise and the tantalum capacitor not generating acoustic noise are combined in a predetermined volume ratio at the time of being mounted on a board, an excellent effect of reducing acoustic noise may be obtained.

Also, since a plating layer is not formed on the external electrodes of the MLCC of the composite electronic component, degradations in product reliability due to penetration of a plating solution may be eliminated.

According to an exemplary embodiment of the present disclosure, a coupling volume ratio of the tantalum capacitor 120 and the MLCC 110 (tantalum capacitor: MLCC) may be within a range of 2:8 to 9:1.

By adjusting the coupling volume ratio of the tantalum capacitor 120 and the MLCC 110 to satisfy the range of the 2:8 to 9:1, a composite electronic component having a low ESR value and excellent acoustic noise improvement effect may be implemented. In some embodiments, the tantalum capacitor 120 and the MLCC 110 may be combined in a volume ratio of 5:5 to 7:3.

In a case in which the coupling volume ratio of the tantalum capacitor 120 is less than 5, a high capacity electronic component may not be realized, and in a case in which the coupling volume ratio exceeds 7, the ESR and voltage ripples (ΔV) values may increase.

In the composite body 130 according to the first exemplary embodiment of the present disclosure, the MLCC 110 may be coupled to the side of the tantalum capacitor 120.

A method of coupling the MLCC 110 to the tantalum capacitor 120 is not particularly limited, and the MLCC 110 may be coupled to the tantalum capacitor 120 by applying an adhesive to the side of the tantalum capacitor 120.

The MLCC 110 and the tantalum capacitor 120 may be connected in parallel.

According to an exemplary embodiment of the present disclosure, as illustrated in FIG. 2, the MLCC 110 and the tantalum capacitor 120 may be disposed on the insulating sheet 140.

The insulating sheet 140 may be formed of any material as long as the material exhibits insulating properties, without being particularly limited, and may be formed using a ceramic-based material insulating material.

The conductive connectors 141 and 142 may be disposed on one or both of the upper and lower surfaces of the insulating sheet 140.

A shape of the conductive connectors 141 and 142 is not particularly limited as long as the conductive connectors 141 and 142 electrically connect the anode and cathode terminals provided outside the mold 150 to the composite body within the mold 150.

For example, as illustrated in FIG. 2, the conductive connectors 141 and 142 may have a metal pad shape, but the shape of the conductive connectors 141 and 142 is not limited thereto.

Also, the conductive connectors 141 and 142 may include copper (Cu) as a conductive metal, but the material of the conductive connectors 141 and 142 is not limited thereto.

As described hereinafter, the conductive connectors 141 and 142 may be connected to the first and second external electrodes 131 and 132 of the MLCC 110, respectively.

Also, the anode terminal and the cathode terminal may be connected to the first external electrode 131 and the second external electrode 132 through the conductive connectors 141 and 142, respectively.

The body 122 of the tantalum capacitor 120 may be connected to the cathode terminal through the conductive connector 142, but the connection of the present disclosure is not limited thereto.

An insulating layer 170 may be disposed between the MLCC 110 and the tantalum capacitor 120 to prevent short-circuiting of each element disposed in the composite electronic component.

The mold 150 is formed to cover the MLCC 110, the tantalum capacitor 120, and the upper surface of the insulating sheet 140 on which the MLCC 120 and the tantalum capacitor are disposed.

The mold 150 protects the MLCC 110 and the tantalum capacitor 120 from an external environment, and may be formed of an epoxy molding compound based on epoxy or silica, but a material of the mold 150 is not limited thereto.

Due to the mold 150, the composite electronic component according to an exemplary embodiment of the present disclosure may be implemented as a single component combining the MLCC 110 and the tantalum capacitor 120.

According to an exemplary embodiment of the present disclosure, the tantalum wire 121 may be exposed to a first side of the mold 150 in a length direction.

The tantalum capacitor 120 may be a tantalum capacitor having a structure without an internal lead frame, and since the tantalum wire 121 is exposed to the first side of the mold 150 in the length direction, capacity thereof may be significantly increased, compared with the related art structure.

The conductive connectors 141 and 142 may be exposed to a first lateral surface of the mold 150 in the length direction.

Hereinafter, a structure in which the MLCC and the tantalum capacitor included in the composite electronic component according to an exemplary embodiment of the present disclosure are connected to terminal electrodes will be described, but the structure may not be limited thereto.

Figure 3:
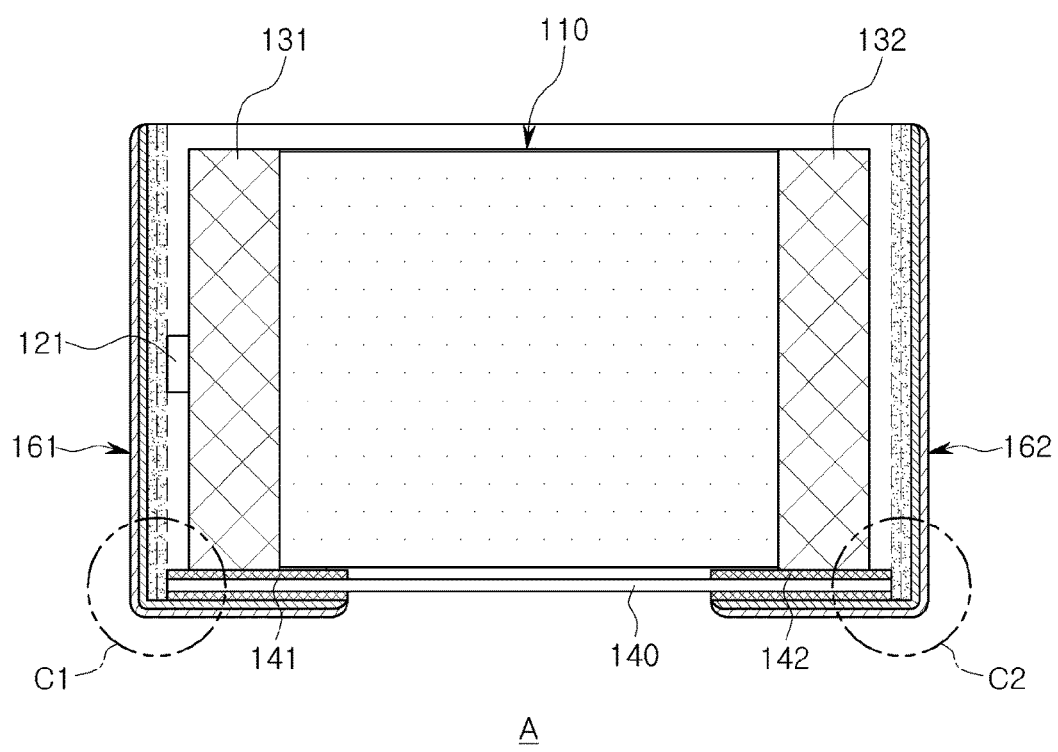
FIG. 3 is a cross-sectional view taken in direction "A" of FIG. 2.

FIG. 3 is a cross-sectional view taken in direction "A" of FIG. 2.

Figure 4:
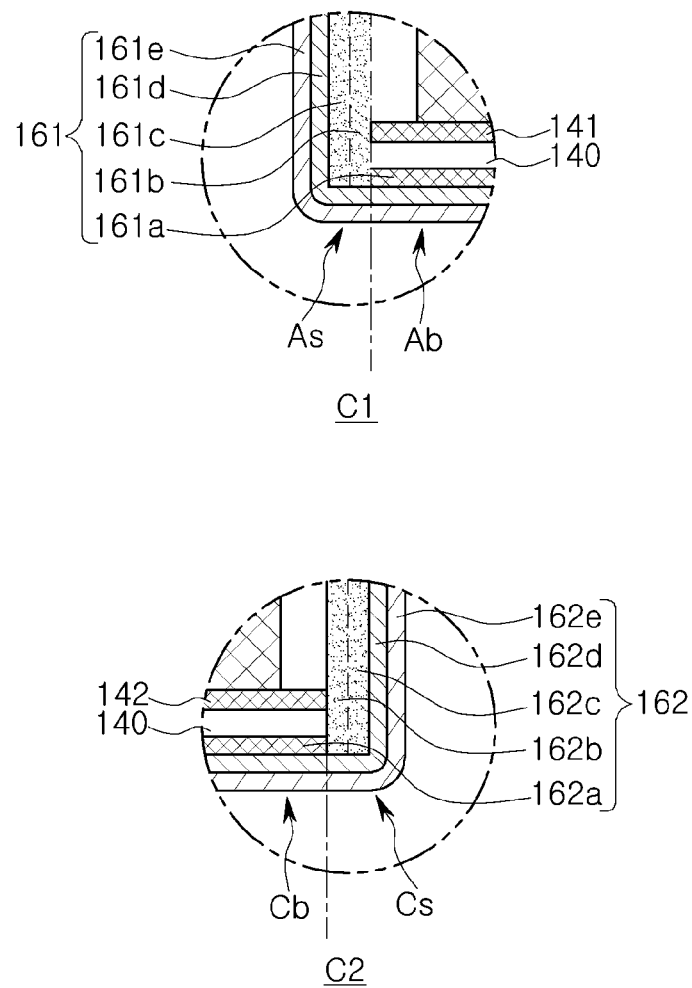
FIG. 4 illustrates enlarged views of regions C1 and C2 of FIG. 3.

FIG. 4 is an enlarged view of regions C1 and C2 of FIG. 3.

Referring to FIGS. 3 and 4, the terminal electrodes may include an anode terminal 161 and a cathode terminal 162.

The anode terminal 161 may be disposed on a first lateral surface of the mold 150 in the length direction and on a lower surface of the mold 150 and connected to the tantalum wire 121 and the first external electrode 131. The cathode terminal 162 may be disposed on a second lateral surface of the mold 150 in the length direction and on a lower surface of the mold 150 and connected to the body 122 of the tantalum capacitor 120 and the second external electrode 132.

The anode terminal 161 and the first external electrode 131 may be connected to each other through one conductive connector 141, among the conductive connectors 141 and 142. The cathode terminal 162 and the second external electrode 132 may be connected through the other conductive connector 142, among the conductive connectors 141 and 142.

According to an exemplary embodiment of the present disclosure, the anode terminal 161 may extend from the first lateral surface of the mold 150 in the length direction to a portion of a lower surface of the insulating sheet 140. The cathode terminal 162 may extend from the second lateral surface of the mold 150 in the length direction to a portion of the lower surface of the insulating sheet 140. The anode terminal 161 and the cathode terminal 162 may be spaced apart from each other on the lower surface of the insulating sheet 140.

The anode terminal 161 may include a lateral anode terminal portion As disposed on the lateral surface of the mold 150 and a lower anode terminal portion Ab disposed on the lower surface of the insulating sheet 140. The cathode terminal 162 may include a lateral cathode terminal portion Cs disposed on the lateral surface of the mold 150 and a lower cathode terminal portion Cb disposed on the lower surface of the insulating sheet 140.

According to an exemplary embodiment of the present disclosure, the anode terminal 161 may include a lower base layer 161a, lateral base layers 161b and 161c connected to the lower base layer 161a, and plating layers 161d and 161e disposed to surround the lower base layer 161a and the lateral base layers 161b and 161c. The cathode terminal 162 may include a lower base layer 162a, lateral base layers 162b and 162c connected to the lower base layer 162a, and plating layers 162d and 162e disposed to surround the lower base layer 162a and the lateral base layers 162b and 162c.

In FIG. 3, the lower base layers 161a and 162a are illustrated as a single layer and the lateral base layers 161b and 161c and 162b and 162c are illustrated as two layers, but the layers may be disposed in various forms without being limited thereto.

The anode terminal 161 and the cathode terminal 162 may be formed through a process of dry etching (sputtering) and plating using at least one of chromium (Cr), titanium (Ti), copper (Cu), nickel (Ni), palladium (Pd), and gold (Au), and forming a metal layer, and etching the metal layer, but the way in which the anode terminal 161 and the cathode terminal 162 are formed is not limited thereto.

The anode terminal 161 and the cathode terminal 162 may be formed by first forming the lower terminal portions Ab and Cb and subsequently forming the lateral terminal portions As and Cs to be connected to the lower terminal portions Ab and Cb.

The lower base layers 161a and 162a may be formed through etching, but are not limited thereto.

The lower base layers 161a and 162a may be disposed on the lower surface of the insulating sheet 140, and after a metal thin film is formed on the lower surface of the insulating sheet 140, an etching process may be performed to form a pattern, thus forming the lower anode terminal portion Ab and the lower cathode terminal portion Cb.

The lower base layers 161a and 162a may include, for example, copper (Cu), but the material of the lower base layers 161a and 162a is not limited thereto. When the lower base layers 161a and 162a are formed using copper (Cu), the lower base layers 161a and 162a may have excellent connectivity with the lateral anode terminal portion As and the lower cathode terminal portion Cb formed through a separate process, and may have excellent electrical conductivity.

The lateral base layers 161b, 161c, 162b, and 162c may be formed through deposition, for example, sputtering. The lateral base layers 161b, 161c, 162b, and 162c may include two layers, inner and outer layers, but are not limited thereto.

Among the lateral base layers 161b, 161c, 162b, and 162c, the inner lateral base layers 161b and 162b may include one or both of chromium (Cr) and titanium (Ti), may be formed through sputtering, and may be connected to the base layers 161a and 162a, respectively.

Among the lateral base layers 161b, 161c, 162b, and 162c, the outer lateral base layers 161c and 162c may include copper (Cu) and may be formed through sputtering.

Figure 5:
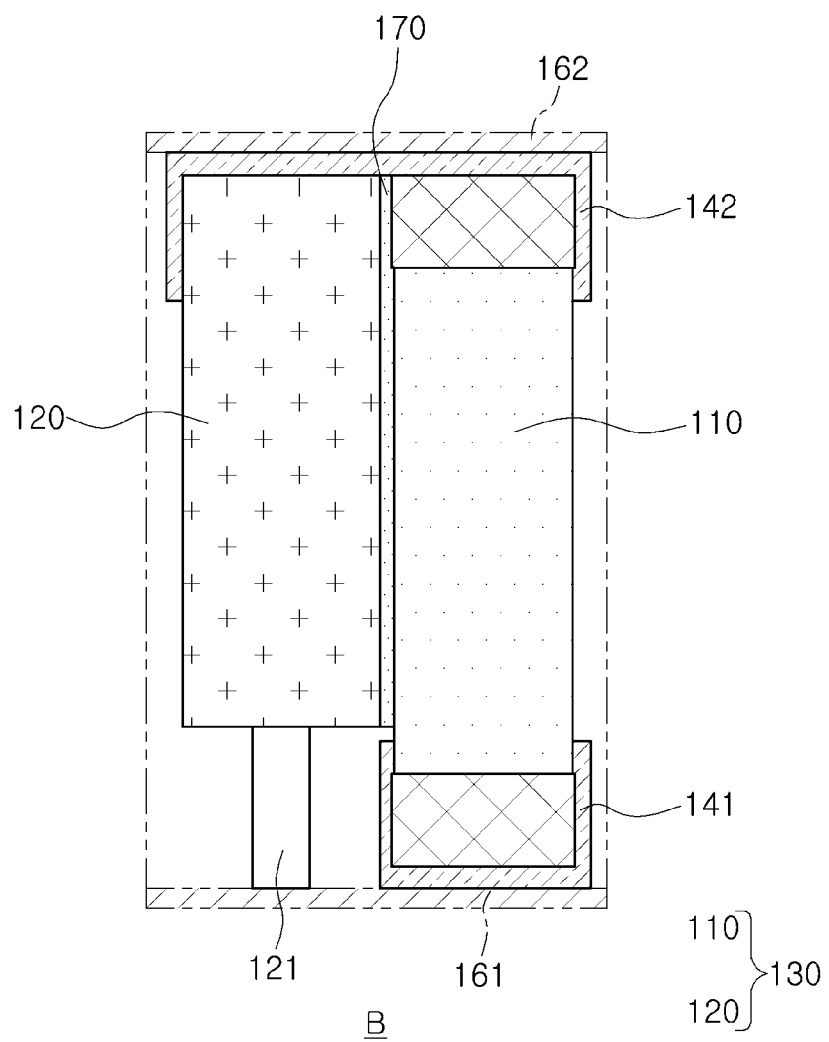
FIG. 5 is a cross-sectional top view taken in direction "B" of FIG. 2.

FIG. 5 is a cross-sectional top view taken in direction "B" of FIG. 2.

Referring to FIG. 5, the tantalum wire 121 of the tantalum capacitor 120 may be exposed to the first lateral surface of the mold 150 in the length direction and electrically connected to the anode terminal 161, and the anode terminal 161 and the first external electrode 131 may be connected through one conductive connector 141, among the conductive connectors 141 and 142.

The body 122 of the tantalum capacitor may be electrically connected to the cathode terminal 162 disposed on the second lateral surface of the mold 150 in the length direction, and the cathode terminal 162 and the second external electrode 132 may be connected to each other through the other conductive connector 142, among the conductive connectors 141 and 142.

The anode terminal 161 and the cathode terminal 162 may serve as a signal input terminal and a ground terminal, respectively, but the role of the anode terminal 161 and the cathode terminal 162 is not limited thereto.

Figure 6:
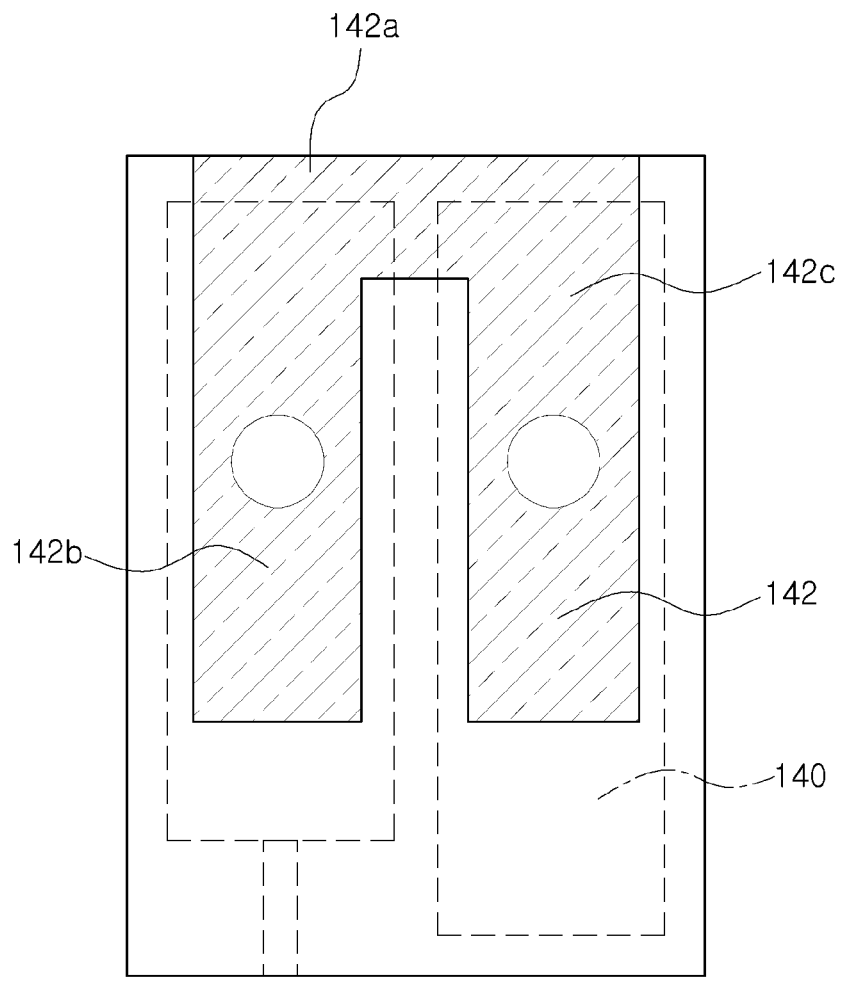
FIG. 6 is a plan view illustrating an exemplary embodiment of a conductive connector.

FIG. 6 is a plan view illustrating an exemplary embodiment of a conductive connector. Referring to FIG. 6, the conductive connector 142 includes a lead-out portion 142a exposed to one end of the insulating sheet 140, and a first extending portion 142b and a second extending portion 142c extending from the lead-out portion 142a in a first lateral surface of the mold in the length direction.

The tantalum capacitor 120 may be disposed in the first extending portion 142b, and the MLCC 110 may be disposed in the second extending portion 142c.

Although not illustrated in the drawings, the second extending portion 142c may be shorter than the first extending portion 142b so as to prevent short-circuits between the external electrodes of the MLCC 110.

Alternatively, the second extending portion 142c may not be formed, and the second external electrode 132 of the MLCC 110 may be disposed in the lead-out portion 142a.

Although not being particularly limited, the first extending portion 142b and the tantalum capacitor 120, and the second extending portion 142c or the lead-out portion 142a and the external electrode 132 of the MLCC 110, may be bonded, respectively, using conductive paste.

The conductive paste may serve to secure electrical connection between the conductive connector 140 and the tantalum capacitor 120 and between the conductive connector 140 and the MLCC 110 and to allow the tantalum capacitor 120 and the MLCC 110 to be disposed on the insulating sheet.

Since the conductive connector 140 and the tantalum capacitor 120 and the conductive connector 140 and the MLCC 110 are firmly tightly attached by the conductive paste, bonding resistance may be reduced, and thus, low ESR characteristics of the MLCC 110 may be effectively manifested.

The second extending portion 142c or the lead-out portion 142a of the conductive connector 142 may be connected to the second external electrode 132 among the first and second external electrodes 131 and 132 of the MLCC 110.

The lead-out portion 142a of the conductive connector 142 may be led out to the second lateral surface of the mold 150 in the length direction and connected to the cathode terminal 162 formed on the lateral surface of the mold 150.

The tantalum wire 121 of the tantalum capacitor 120 may be directly led out to the lateral surface of the mold 150, and the first external electrode 131 of the MLCC 110 may be led out to the lateral surface) of the mold 150 through the conductive paste and connected to the anode terminal 161 formed on the lateral surface of the mold 150.

According to the exemplary embodiment of the present disclosure, the first extending portion 142b and the second extending portion 142c may be spaced apart from one another to prevent a short-circuit between the tantalum capacitor 120 and the MLCC 110.

Figure 7:
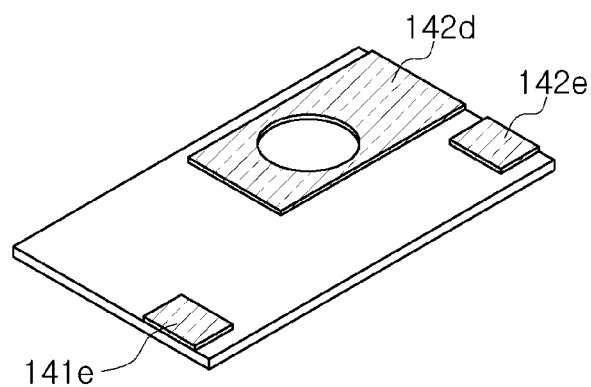
FIG. 7 is a plan view illustrating another exemplary embodiment of a conductive connector.

FIG. 7 is a plan view illustrating another exemplary embodiment of a conductive connector.

Referring to FIG. 7, the conductive connectors 141 and 142 may include a first conductive connector 142d exposed to one end of the insulating sheet 140 to allow the tantalum capacitor 120 to be disposed therein A pair of second conductive connectors 141e and 142e, exposed to both ends of the insulating sheet 140 and spaced apart from each other, allow the MLCC 110 to be disposed therein.

The body 122 of the tantalum capacitor 120 may be connected to the first conductive connector 142d, and the first and second external units 131 and 132 of the MLCC 110 may be connected to the pair of second conductive connectors 141e and 142e, respectively.

The body 122 of the tantalum capacitor 120 and the first and second external electrodes 131 and 132 of the MLCC 110 may be directly connected to the conductive connectors 141 and 142 or may be connected by conductive paste.

The first conductive connector 142d and the pair of second conductive connectors 141e and 142e may be exposed to the lateral surfaces of the mold 150 and connected to the anode terminal 161 and the cathode terminal 162, respectively.

The body 122 of the tantalum capacitor 120 and the first and second external electrodes 131 and 132 of the MLCC 110 may be connected to conductive paste exposed to the lateral surfaces of the mold 150.

According to an exemplary embodiment of the present disclosure, since the first conductive connector 142d and the pair of second conductive connectors 141e and 142e are separately formed, a short-circuit of the tantalum capacitor 120 and the MLCC 110 may be prevented.

According to an exemplary embodiment of the present disclosure, the tantalum capacitor 120 and the MLCC 110 may be independently connected in parallel. The tantalum capacitor 120 and the MLCC 110 may be connected by conductive paste after chemically etching the electrode portions.

Figure 8:
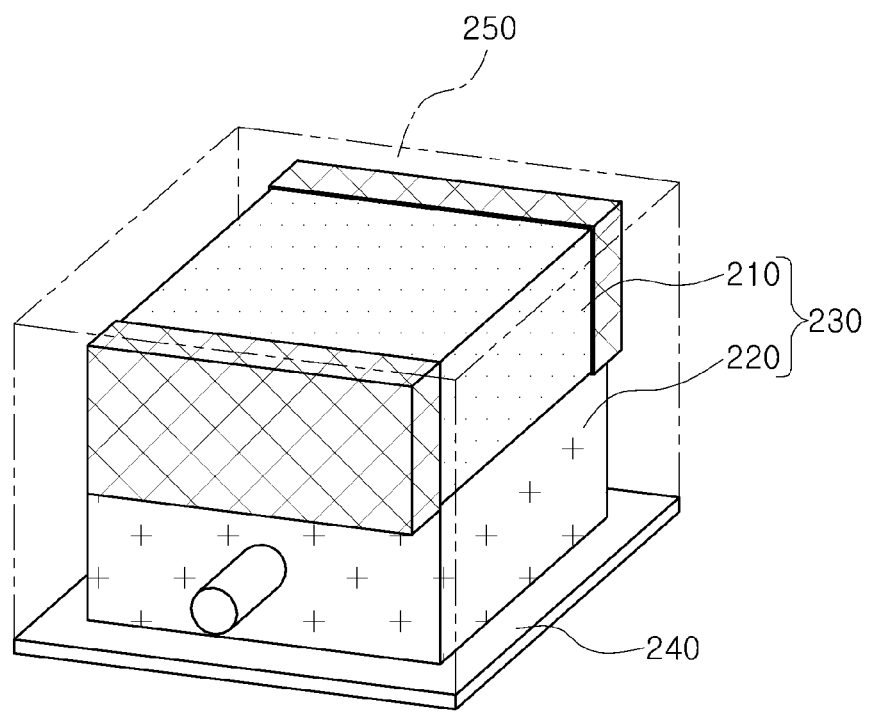
FIG. 8 is a perspective view schematically illustrating a composite electronic component according to a second exemplary embodiment of the present disclosure.

FIG. 8 is a perspective view schematically illustrating a composite electronic component according to a second exemplary embodiment of the present disclosure.

Referring to FIG. 8, in the composite electronic component according to the second exemplary embodiment of the present disclosure, an MLCC 210 may be coupled to an upper portion of a tantalum capacitor 220.

For example, a composite body 230 as a combination of the tantalum capacitor 220 and the MLCC 210 provided on the tantalum capacitor 220 may be disposed on an upper portion of an insulating sheet 240.

Since the MLCC 210 is coupled to an upper portion of the tantalum capacitor 220, an improved acoustic noise reduction effect may be obtained when the composite electronic component is mounted on a board.

Although not particularly limited, the tantalum capacitor 220 may be, for example, a tantalum capacitor having a structure without an internal lead frame.

Alternatively, a tantalum capacitor 220 having a structure in which tantalum oxide ($Ta_2O_5$) is formed on a surface of tantalum using anodizing and a conductive polymer layer is disposed thereon using the tantalum oxide ($Ta_2O_5$) as a dielectric material without an internal lead frame may be used.

The MLCC 210 and the tantalum capacitor 220 may be connected in parallel.

The composite electronic component according to the second exemplary embodiment of the present disclosure includes a mold 250 disposed to cover the composite body 230.

Figure 9:
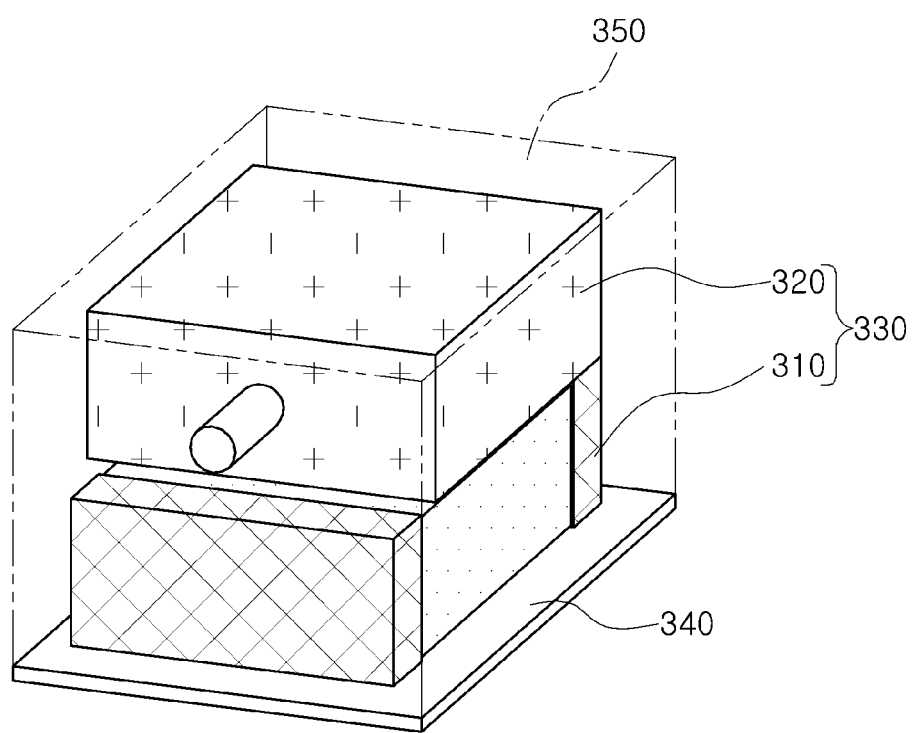
FIG. 9 is a perspective view schematically illustrating a composite electronic component according to a third exemplary embodiment of the present disclosure.

FIG. 9 is a perspective view schematically illustrating a composite electronic component according to a third exemplary embodiment of the present disclosure. Referring to FIG. 9, in the composite electronic component according to a third exemplary embodiment of the present disclosure, an MLCC 310 may be coupled to a lower portion of a tantalum capacitor 320.

For example, a composite body 330 as a combination of the MLCC 310 and the tantalum capacitor 320 coupled to an upper portion of the MLCC 310 may be disposed on an insulating sheet 340.

Since the MLCC 310 is coupled to the lower portion of the tantalum capacitor 320, a current loop may be shortened when the composite electronic component is mounted on a board, and thus, ESL of the composite electronic component may be further reduced.

Although not particularly limited, the tantalum capacitor 320 may be, for example, a tantalum capacitor having a structure without an internal lead frame.

Alternatively, a tantalum capacitor 320 having a structure in which tantalum oxide ($Ta_2O_5$) is formed on a surface of tantalum using anodizing and a conductive polymer layer is disposed thereon using the tantalum oxide ($Ta_2O_5$) as a dielectric material, without an internal lead frame, may be used.

The MLCC 310 and the tantalum capacitor 320 may be connected in parallel.

The composite electronic component according to the third exemplary embodiment of the present disclosure includes a mold 350 disposed to cover the composite body 330.

Figure 10:
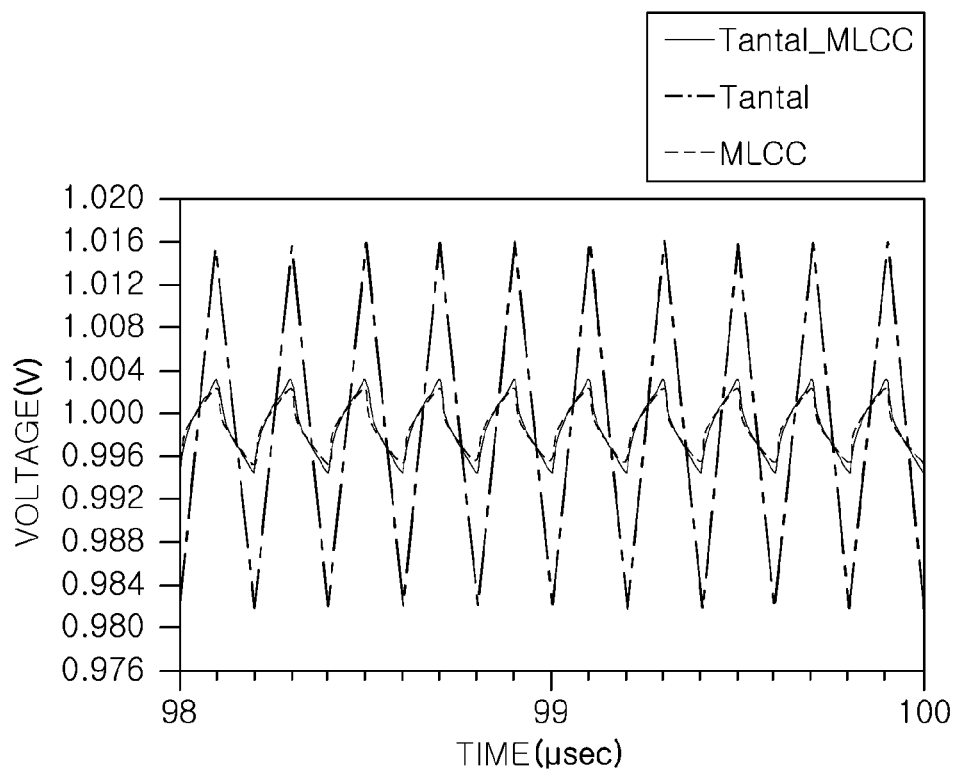
FIG. 10 is a graph illustrating output voltages of exemplary embodiment of the present disclosure and Comparative Examples over time.

FIG. 10 is a graph illustrating output voltages of an exemplary embodiment of the present disclosure and comparative examples over time. Referring to FIG. 10, the exemplary embodiment of the present disclosure has voltage ripples significantly reduced, compared with Comparative Example employing only a tantalum capacitor, and similar to that of Comparative Example using only an MLCC.

For example, it can be seen that Comparative Example employing only a tantalum capacitor has voltage ripples equal to 34 mV, while the exemplary embodiment of the present disclosure has voltage ripples reduced to 9 mV similar to that (7 mV) of Comparative Example using only an MLCC.

Figure 11:
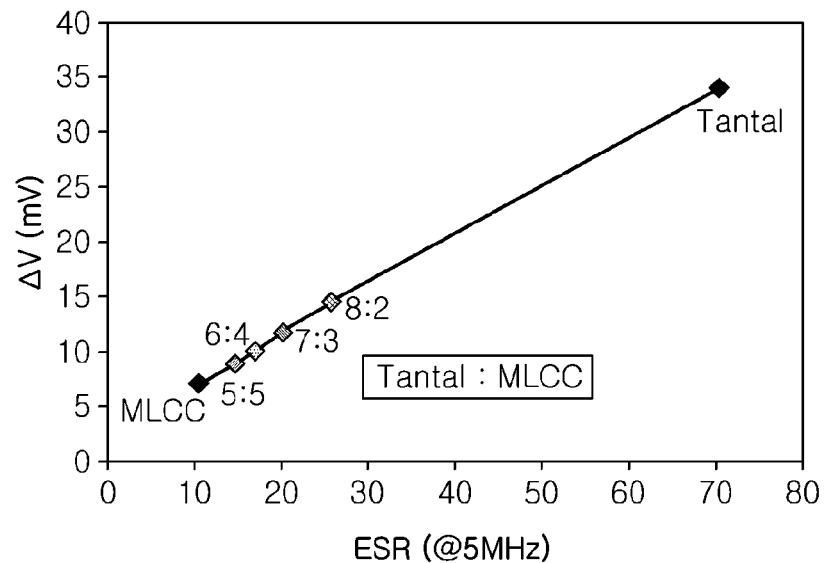
FIG. 11 is a graph illustrating voltage ripples (ΔV) over ESR according to a volume ratio of a multilayer ceramic capacitor and a tantalum capacitor in a composite electronic component according to an exemplary embodiment of the present disclosure.

FIG. 11 is a graph illustrating voltage ripples ΔV over ESR according to a volume ratio of an MLCC and a tantalum capacitor in a composite electronic component according to an exemplary embodiment of the present disclosure.

Referring to FIG. 11, in an exemplary embodiment of the present disclosure, it can be seen that an electronic component having low ESR and voltage ripples ΔV and high capacity is implemented when coupling volume ratios of a tantalum capacitor and an MLCC are 5:5 to 7:3.

According to another exemplary embodiment of the present disclosure, there is provided a composite electronic component including an input terminal receiving power converted by a power manager. The power smoother smoothing the power includes an MLCC having a ceramic body, in which a plurality of dielectric layers and internal electrodes are stacked such that the internal electrodes face one another with the dielectric layer interposed therebetween, and a tantalum capacitor containing tantalum powder and including a body having a tantalum wire protruding from one end portion thereof. A ground terminal bypasses ripples in the power, such that the power smoother may reduce ripples in the provided power.

The composite electronic component according to another exemplary embodiment of the present disclosure may refer to an electronic component including a single composite body formed by combining an MLCC and a tantalum capacitor, which may be used instead of a capacitor as a partial component among a plurality of inductors and capacitors connected to a power manager (i.e., a power management integrated circuit (PMIC)) to smooth power.

According to another exemplary embodiment of the present disclosure, a capacitor of the power smoother receiving power converted by the power manager and smoothing the same is undertaken by a single composite electronic component, but the present disclosure is not limited thereto.

The composite electronic component includes an input terminal receiving power converted by a power manager. A power smoother smoothing the power includes an MLCC having a ceramic body, in which a plurality of dielectric layers and internal electrodes are stacked such that the internal electrodes face one another with the dielectric layer interposed therebetween, and a tantalum capacitor containing tantalum powder and including a body having a tantalum wire protruding from one end portion thereof. A ground terminal bypasses ripples in the power.

Figure 12:
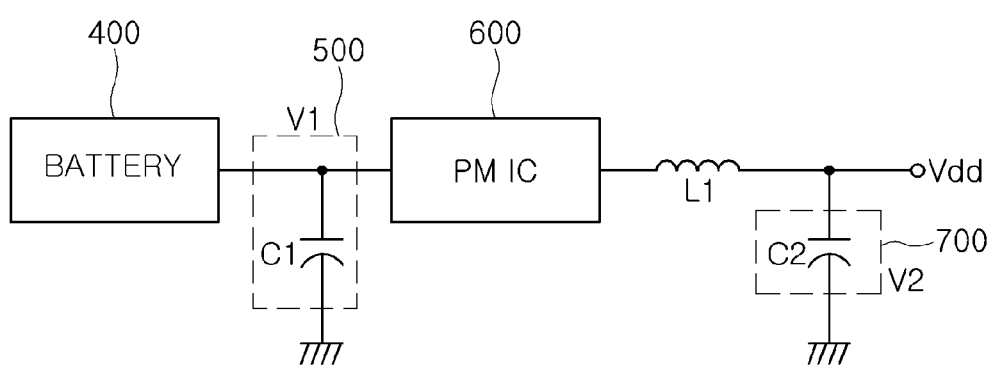
FIG. 12 is a view illustrating a driving power supply system supplying driving power to a terminal requiring driving power through a battery and a power manager.

FIG. 12 is a view illustrating a driving power supply system supplying driving power to a predetermined terminal requiring driving power through a battery and a power manager. Referring to FIG. 12, the driving power supply system may include a battery 400, a first power smoother 500, a power manager 600, and a second power smoother 700.

The battery 400 may supply power to the power manager 600. Here, power supplied from the battery 400 to the power manager 600 is defined as first power.

The first power smoother 500 may smooth the first power V1 and supply the first smoothed power to the power manager 600. In detail, the first power smoother 500 may include a capacitor C1 disposed between a connection terminal of the battery 400 and the power manager 600 and a ground. The capacitor C1 may reduce ripples included in the first power.

The capacitor C1 may charge electric charges. In a case in which the power manager 600 instantaneously consumes a large amount of current, the capacitor C1 may discharge charged electric charges to suppress voltage fluctuations in the power manager 600.

According to an exemplary embodiment of the present disclosure, a composite electronic component including the composite body 130 provided by combining the MLCC 110 and the tantalum capacitor 120 may be used instead of the capacitor C1.

The power manager 600 serves to convert power introduced to an electronic device into a form fitting the electronic device, and distribute, charge, and control power. Thus, the power manager 600 may generally include a DC/DC converter.

Also, the power manager 600 may be implemented by a power management integrated circuit (PMIC). The power manager 600 may convert the first power V1 into second power V2.

The second power smoother 700 may smooth the second power V2 and deliver the smoothed second power to an output terminal Vdd. An active element such as IC, or the like, receiving driving power from the power manager 600 may be connected to the output terminal Vdd.

In detail, the second power smoother 700 may include a capacitor C2 disposed between a connection terminal of the power manager 600 and the output terminal Vdd and a ground.

The second power smoother 700 may reduce ripples included in the second power V2.

Also, the second power smoother 700 may stably supply power to the output terminal Vdd.

According to an exemplary embodiment of the present disclosure, a composite electronic component including the composite body 130 in which the MLCC 110 and the tantalum capacitor 120 are combined may be used instead of the capacitor C2.

Table 1 illustrates results of determining capacitance, ESR, and voltage ripple ΔV characteristics according to volume ratios of a tantalum capacitor and an MLCC (volume of tantalum capacitor: volume of MLCC) in a composite electronic component.

TABLE 1

| Sample | Volume Ratio of Tantalum Capacitor and MLCC | Capacitance (μF) | ESR (mΩ) | ESL (pH) | Acoustic Noise (dBA) |
|---|---|---|---|---|---|
| 1* | 10:0 | 45.0 | 150 | 471 | 16.6 |
| 2* | 9.5:0.5 | 44.9 | 58 | 415 | 16.6 |
| 3 | 9:1 | 44.7 | 27 | 369 | 16.7 |
| 4 | 8:2 | 44.4 | 22 | 313 | 16.7 |
| 5 | 7:3 | 44.1 | 17 | 281 | 16.8 |
| 6 | 6:4 | 43.8 | 13 | 258 | 16.9 |
| 7 | 5:5 | 43.5 | 11 | 240 | 16.9 |
| 8 | 4:6 | 43.0 | 9.2 | 225 | 17.3 |
| 9 | 3:7 | 42.9 | 8.3 | 213 | 17.5 |
| 10 | 2:8 | 42.6 | 7.3 | 203 | 18.1 |
| 11* | 1:9 | 42.3 | 6.2 | 197 | 26.5 |
| 12* | 0:10 | 42.0 | 5.1 | 207 | 28.2 |

*Comparative Example

Referring to Table 1, it can be appreciated that samples 1 and 2 in which the coupling volume ratio of the tantalum capacitor exceeds 9 have high ESR in composite electronic components.

When a capacitor used in a power terminal has an ESR value exceeding 30 mΩ, voltage ripples and radiation noise increase and power efficiency is lowered.

Samples 11 and 12 correspond to cases in which a coupling volume ratio of the tantalum capacitor is less than 2 and an acoustic noise reduction effect does not appear to be significantly high.

Samples 3 through 10 are exemplary embodiments of the present disclosure and have ratios of volumes of the tantalum capacitor and the MLCC, at the time of combination thereof, ranging from 9:1 to 2:8, realizing a composite electronic component having a low ESR value and an excellent acoustic noise improvement effect.

Board Having Composite Electronic Component

Figure 13:
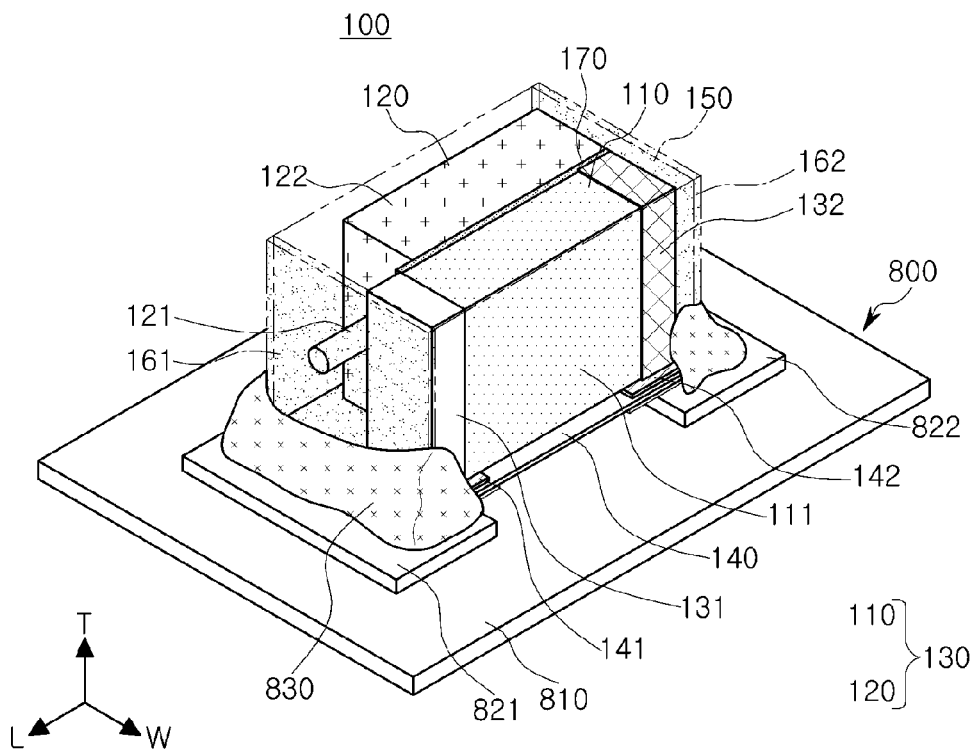
FIG. 13 is a perspective view illustrating a composite electronic component of FIG. 2 mounted on a printed circuit board.

FIG. 13 is a perspective view illustrating a composite electronic component of FIG. 2 mounted on a printed circuit board. Referring to FIG. 13, a board 800 having a composite electronic component according to another exemplary embodiment of the present disclosure includes a printed circuit board (PCB) 810 having electrode pads 821 and 822 provided thereon, the composite electronic component 100 installed on the PCB 810, and a solder 830 connecting the electrode pads 821 and 822 and the composite electronic component 100.

The board 800 having a composite electronic component according to the exemplary embodiment of the present disclosure includes the PCB 810 on which the composite electronic component 100 is mounted and two or more electrode pads 821 and 822 formed on an upper surface of the PCB 810.

The electrode pads 821 and 822 include first and second electrode pads 821 and 822 respectively connected to the anode terminal 161 and the cathode terminal 162 of the composite electronic component.

Here, in a state in which the anode and cathode terminals 161 and 162 of the composite electronic component are positioned to be in contact with the first and second electrode pads 821 and 822, respectively, the anode and cathode terminals 161 and 162 may be electrically connected to the PCB 810 by the solder 830.

Power Smoother

Figure 14:
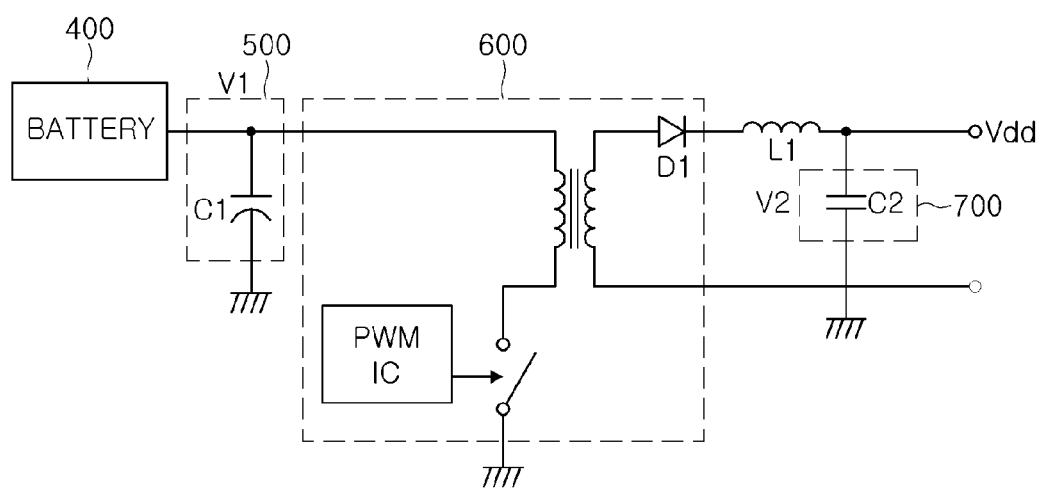
FIG. 14 is a detailed circuit diagram of a power smoother including a composite electronic component according to an exemplary embodiment of the present disclosure.

FIG. 14 is a detailed circuit diagram of a power smoother system including a composite electronic component according to an exemplary embodiment of the present disclosure.

According to another exemplary embodiment of the present disclosure, there is provided a power smoother including: a battery 400, a first power smoother 500 smoothing power supplied from the battery 400, a power manager 600 converting power provided by the first power smoother 500 through a switching operation, and a second power smoother 700 smoothing power provided by the power manager 600. The first power smoother 500 or the second power smoother 700 includes a composite electronic component formed by combining a capacitor, including a ceramic body in which a plurality of dielectric layers and internal electrodes are stacked such that the internal electrodes face one another with the dielectric layer interposed therebetween, and a tantalum capacitor containing tantalum powder and including a body having a tantalum wire protruding from one end portion thereof. The composite electronic component reduces ripples in the received power.

Referring to FIG. 14, the power smoother system may include the battery 400, the first power smoother 500 smoothing power supplied by the battery 400, the power manager 600 converting power provided from the first power smoother 500 through a switching operation, and the second power smoother 700 smoothing power provided from the power manager 600.

The power manager 600 may include a transformer in which a primary side and a secondary side are insulated from one each; a switch positioned on the primary side of the transformer, used to perform a switching operation on power provided by the first power smoother 500, a power management integrated circuit (PWM IC) controlling the switching operation of the switch; and a rectifier positioned on the secondary side of the transformer and rectifying the power.

For example, the power manager 600 may convert power, for example, a first voltage V1, provided from the first power smoother 500 into a second voltage V2 through a switching operation of the switch. Here, the PWM IC, among the components of the power manager 600, may control the switching operation of the switching unit to convert the first voltage V1 to the second voltage V2.

Thereafter, the second voltage V2 may be rectified by the rectifier, for example, a diode D1, and may be provided to the second power smoother 700.

The first power smoother 500 or the second power smoother 700 may be a composite electronic component including a composite body formed by combining a multilayer ceramic capacitor, having a ceramic body, in which a plurality of dielectric layers and internal electrodes are stacked such that the internal electrodes face one another with the dielectric layer interposed therebetween, and a tantalum capacitor containing tantalum powder and including a body having a tantalum wire formed on one end portion thereof. Also, the composite electronic component may reduce ripples in the received second voltage V2.

According to exemplary embodiments of the present disclosure, a composite electronic component having an excellent acoustic noise reduction effect may be provided.

Also, according to exemplary embodiments of the present disclosure, a composite electronic component having high capacity, low ESR/ESL, enhanced DC-bias characteristics, and a small chip thickness may be provided.

While exemplary embodiments have been shown and described above, it will be apparent to those skilled in the art that modifications and variations could be made without departing from the scope of the present disclosure as defined by the appended claims.

What is claimed is:

1. A composite electronic component comprising:
   a composite body comprising a multilayer ceramic capacitor (MLCC) and a tantalum capacitor, the tantalum capacitor having a tantalum wire extending from a body;
   a first conductive connector and a second conductive connectors disposed below the composite body, wherein each of the first and the second conductive connectors are separated from each other;
   a mold covering the composite body; and
   an anode terminal disposed on a first lateral surface and a lower surface of the mold in a length direction, the anode terminal directly connected to the tantalum wire and the first external electrode,
   wherein the composite electronic package is configured such that, in a line of a line graph of equivalent series resistance (ESR) of an input signal over frequency, points of inflection of the ESR occur in at least one region prior to or subsequent to a point of self resonant frequency (SRF).

2. The composite electronic component of claim 1, wherein the composite body is disposed on an upper surface of an insulating sheet including the first conductive connector and the second conductive connectors being disposed on one or both of upper and lower surfaces of the insulating sheet,
   the MLCC includes a ceramic body in which a plurality of dielectric layers and internal electrodes are stacked such that the internal electrodes face one another with the dielectric layer interposed therebetween and first and second external electrodes disposed on exterior surfaces of the ceramic body, and
   the tantalum capacitor contains tantalum powder,
   the composite electronic component further comprising:
   a cathode terminal disposed on a second lateral surface and a lower surface of the mold in the length direction and connected to the body of the tantalum capacitor and the second external electrode.

3. The composite electronic component of claim 2, wherein the tantalum capacitor has a structure without a lead frame.

4. The composite electronic component of claim 2, wherein the conductive connectors are exposed to the first lateral surface of the mold in the length direction.

5. The composite electronic component of claim 2, wherein the conductive connectors are connected to the first and second external electrodes, respectively.

6. The composite electronic component of claim 2, wherein the anode terminal and the first external electrode are connected to each other through the first conductive connector and the second conductive connectors.

7. The composite electronic component of claim 2, wherein the cathode terminal and the second external electrode are connected to each other through the first conductive connector and the second conductive connectors.

8. The composite electronic component of claim 2, wherein the conductive connectors include a lead-out portion exposed to the second lateral surface of the mold in the length direction, and first and second extending portions extending from the lead-out portion in a first lateral surface of the mold in the length direction.

9. The composite electronic component of claim 8, wherein the second extending portion is shorter than the first extending portion.

10. The composite electronic component of claim 2, wherein the conductive connectors include a first conductive connector exposed to the second lateral surface of the mold in the length direction and second conductive connectors respectively exposed to the first lateral surface and the second lateral surface of the mold in the length direction.

11. The composite electronic component of claim 10, wherein the first conductive connector and the tantalum capacitor and the second conductive connectors and the MLCC are connected to each other, respectively, using conductive paste.

12. The composite electronic component of claim 2, wherein the anode terminal and the cathode terminal include a lower base layer, lateral base layers connected to the lower base layer, and plating layers disposed to surround the lower base layer and the lateral base layers, respectively.

13. The composite electronic component of claim 1, wherein the MLCC is coupled to one or more of lateral surfaces, an upper surface, and a lower surface of the tantalum capacitor.

14. The composite electronic component of claim 1, wherein the MLCC and the tantalum capacitor have an insulating layer disposed on a coupling surface of the MLCC and the tantalum capacitor.

15. The composite electronic component of claim 1, wherein a coupling volume ratio of the tantalum capacitor and the MLCC ranges from 2:8 to 9:1.

16. A composite electronic component comprising:
an insulating sheet;
a first conductive connector and a second conductive connectors disposed on one or both of upper and lower surfaces of the insulating sheet, wherein each of the first and second conductive connectors are separated from each other;
a composite body disposed on the upper surface of the insulating sheet and formed by combining:
a multilayer ceramic capacitor (MLCC), including a ceramic body in which a plurality of dielectric layers and internal electrodes are stacked such that the internal electrodes face one another with the dielectric layer interposed therebetween, and first and second external electrodes disposed on exterior surfaces of the ceramic body and
a tantalum capacitor containing tantalum powder and comprising a body having a tantalum wire disposed in one end portion of the body;
a mold disposed to cover the composite body;
an anode terminal disposed on a first lateral surface and a lower surface of the mold in a length direction, the anode terminal directly connected to the tantalum wire and the first external electrode; and
a cathode terminal disposed on a second lateral surface and a lower surface of the mold in the length direction and connected to the body of the tantalum capacitor and the second external electrode.

17. The composite electronic component of claim 16, wherein the tantalum capacitor has a structure without a lead frame.

18. The composite electronic component of claim 16, wherein the conductive connectors are exposed to the first lateral surface of the mold in the length direction.

19. The composite electronic component of claim 16, wherein the conductive connectors are connected to the first and second external electrodes, respectively.

20. The composite electronic component of claim 16, wherein the anode terminal and the first external electrode are connected to each other through the first conductive connector and the second conductive connectors.

21. The composite electronic component of claim 16, wherein the cathode terminal and the second external electrode are connected to each other through the first conductive connector and the second conductive connectors.

22. The composite electronic component of claim 16, wherein the conductive connectors include:
a lead-out portion exposed to a second lateral surface of the mold in the length direction; and
first and second extending portions extending from the lead-out portion in a first lateral surface of the mold in the length direction.

23. The composite electronic component of claim 22, wherein the second extending portion is shorter than the first extending portion.

24. The composite electronic component of claim 16, wherein the conductive connectors include:
a first conductive connector exposed to the second lateral surface of the mold in the length direction; and
second conductive connectors respectively exposed to the first lateral surface and the second lateral surface of the mold in the length direction.

25. The composite electronic component of claim 24, wherein the first conductive connector and the tantalum capacitor and the second conductive connectors and the MLCC are connected to each other, respectively, via conductive paste.

26. The composite electronic component of claim 16, wherein the anode terminal and the cathode terminal include a lower base layer, lateral base layers connected to the lower base layer, and plating layers surrounding the lower base layer and the lateral base layers, respectively.

27. The composite electronic component of claim 16, wherein the MLCC is coupled to one or more of lateral surfaces, an upper surface, and a lower surface of the tantalum capacitor.

28. The composite electronic component of claim 16, wherein the MLCC and the tantalum capacitor have an insulating layer disposed on a coupling surface of the MLCC and the tantalum capacitor.

29. The composite electronic component of claim 16, wherein a coupling volume ratio of the tantalum capacitor and the MLCC ranges from 2:8 to 9:1.

30. A composite electronic component comprising:
a multilayer ceramic capacitor (MLCC); and
a tantalum capacitor disposed on a first insulating sheet and embedded in a mold,
wherein the MLCC includes a ceramic body, in which a plurality of dielectric layers and internal electrodes are stacked in an alternating sequence, and first and second external electrodes are disposed on a first conductive connector and second conductive connectors, respectively, on opposing exterior surfaces of the ceramic body, the tantalum capacitor contains tantalum powder and includes a body with a tantalum wire protruding from one end of the body, the mold includes first and second terminals disposed on opposing sides of the mold, the tantalum wire and the first external electrode are electrically connected directly to the first terminal, the tantalum capacitor body and the second external electrode are electrically connected to the second terminal, and wherein each of the first and the second conductive connectors are separated from each other.

31. The composite electronic component of claim 30, wherein the tantalum capacitor and the MLCC are disposed parallel to each other along their respective length directions with a second insulating sheet disposed between the MLCC and the tantalum capacitor.

32. The composite electronic component of claim 30, wherein the first and second external electrodes of the MLCC are disposed on the first and second conductive connectors, respectively, and the first conductive connector and the second conductive connectors are electrically connected to the first and second terminals, respectively.

33. The composite electronic component of claim 32, wherein the tantalum capacitor body is disposed on the second conductive connector at a second end of the tantalum capacitor opposing the one end of the tantalum capacitor.

34. The composite electronic component of claim 30, wherein the second conductive connector and the tantalum capacitor are connected to each other using a conductive paste, and the first and second conductive connectors and the MLCC are connected to each other using the conductive paste.

35. The composite electronic component of claim 30, wherein a volume ratio of the tantalum capacitor to the MLCC ranges from 2:8 to 9:1.

* * * * *